(12) United States Patent
Iwasaki et al.

(10) Patent No.: US 10,923,376 B2
(45) Date of Patent: Feb. 16, 2021

(54) ROTARY STOCKER AND TRANSFER SYSTEM PROVIDED WITH ROTARY STOCKER

(71) Applicants: KAWASAKI JUKOGYO KABUSHIKI KAISHA, Kobe (JP); MEDICAROID CORPORATION, Kobe (JP)

(72) Inventors: Yukio Iwasaki, Kobe (JP); Satoshi Ouchi, Kobe (JP); Eiji Mitsui, Kobe (JP); Junichi Matsuoka, Kobe (JP); Yukihiko Kitano, Kobe (JP)

(73) Assignees: KAWASAKI JUKOGYO KABUSHIKI KAISHA, Kobe (JP); MEDICAROID CORPORATION, Kobe (JP)

( * ) Notice: Subject to any disclaimer, the term of this patent is extended or adjusted under 35 U.S.C. 154(b) by 169 days.

(21) Appl. No.: 16/232,508

(22) Filed: Dec. 26, 2018

(65) Prior Publication Data

US 2019/0193951 A1    Jun. 27, 2019

(30) Foreign Application Priority Data

Dec. 26, 2017    (JP) .................................. 2017-250215

(51) Int. Cl.
| | | |
|---|---|---|
| *H01L 21/677* | (2006.01) | |
| *B25J 15/00* | (2006.01) | |
| *B25J 9/16* | (2006.01) | |
| *G07F 11/54* | (2006.01) | |
| *B65G 47/90* | (2006.01) | |
| *B65G 1/137* | (2006.01) | |

(Continued)

(52) U.S. Cl.
CPC ...... *H01L 21/67769* (2013.01); *B25J 9/1694* (2013.01); *B25J 15/0028* (2013.01); *B65G 1/045* (2013.01); *B65G 1/137* (2013.01); *B65G 47/905* (2013.01); *G07F 11/50* (2013.01); *G07F 11/54* (2013.01); *H01L 21/67778* (2013.01)

(58) Field of Classification Search
CPC ..... H01L 21/67769; G07F 11/50; G07F 11/54
See application file for complete search history.

(56) References Cited

U.S. PATENT DOCUMENTS 6,259,965 B1 * 7/2001 Steele .................. G06Q 10/087
                                                                    221/6
6,357,984 B1 * 3/2002 Zinger .............. H01L 21/67766
                                                                    414/331.05

(Continued)

FOREIGN PATENT DOCUMENTS

JP        2008-545414 A        12/2008

*Primary Examiner* — Thomas Randazzo
(74) *Attorney, Agent, or Firm* — Oliff PLC

(57) ABSTRACT

There is provided a rotary stocker which includes: a base; a rotary part provided on the base and rotatably connected to the base about a rotary axis extending in a vertical direction; a rotary drive device provided for rotating the rotary part; a plurality of shelves on which an object to be placed is placed, the plurality of shelves being fixed to the rotary part and being arranged in a circumferential direction about the rotary axis; and a sensor positioned outside the plurality of shelves in a radial direction of the rotary axis, the sensor capable of detecting whether the object to be placed is placed on each of the shelves positioned between the rotary axis and the sensor.

12 Claims, 7 Drawing Sheets

(51) Int. Cl.
*G07F 11/50* (2006.01)
*B65G 1/04* (2006.01)

(56) References Cited

U.S. PATENT DOCUMENTS

| | | | |
|---|---|---|---|
| 9,022,236 B1* | 5/2015 | Amendolea | A47F 5/02 |
| | | | 211/144 |
| 9,122,272 B2* | 9/2015 | Rebstock | B25J 9/043 |
| 2002/0114687 A1* | 8/2002 | Inui | B65G 1/045 |
| | | | 414/331.05 |
| 2003/0178142 A1* | 9/2003 | de Ridder | H01L 21/67769 |
| | | | 156/345.31 |
| 2003/0215357 A1* | 11/2003 | Malterer | G01N 35/028 |
| | | | 422/50 |
| 2004/0175258 A1* | 9/2004 | Haas | B65G 47/90 |
| | | | 414/273 |
| 2006/0016720 A1* | 1/2006 | Naito | H01L 21/67727 |
| | | | 206/725 |
| 2006/0270027 A1* | 11/2006 | Shaw | G01N 35/0099 |
| | | | 435/303.3 |
| 2008/0124201 A1* | 5/2008 | Izumi | B65G 1/045 |
| | | | 414/280 |
| 2010/0268374 A1* | 10/2010 | Jung | H01L 21/67778 |
| | | | 700/218 |
| 2012/0027547 A1* | 2/2012 | Jager | H01L 21/6734 |
| | | | 414/287 |
| 2012/0283867 A1* | 11/2012 | Gelbman | G01N 35/04 |
| | | | 700/215 |
| 2013/0038963 A1* | 2/2013 | Nespeca | G11B 15/6835 |
| | | | 360/92.1 |
| 2014/0025545 A1* | 1/2014 | Carson | G06Q 30/018 |
| | | | 705/29 |
| 2014/0124331 A1* | 5/2014 | Fukushima | H01L 21/67769 |
| | | | 198/347.2 |
| 2014/0262690 A1* | 9/2014 | Henderson | G06Q 10/0833 |
| | | | 198/602 |
| 2016/0238625 A1* | 8/2016 | Raicu | B65G 1/06 |
| 2018/0111757 A1* | 4/2018 | Abe | H01L 21/67259 |

* cited by examiner

ROTARY STOCKER AND TRANSFER SYSTEM PROVIDED WITH ROTARY STOCKER

CROSS-REFERENCE TO RELATED APPLICATION

This application claims priority to and the benefit of Japanese Patent Application No. 2017-250215, filed on Dec. 26, 2017, the entire disclosure of which is incorporated herein by reference.

BACKGROUND OF THE INVENTION

(1) Field of the Invention

The present invention relates to a rotary stocker which stores microplates, chip racks and the like, and a transfer system provided with the rotary stocker.

(2) Description of Related Art

Conventionally, there have been known a rotary stocker which stores microplates, chip racks or the like. For example, Japanese National Phase PCT Laid-Open Publication No. 2008-545414 discloses a rotary stocker provided with a plurality of shelves. On each shelf of the rotary stocker, sample containers are placed by a robot. A sensor is provided on each shelf. Although the usage of the sensor is not described in detail in Japanese National Phase PCT Laid-Open Publication No. 2008-545414, it is considered that the sensor includes a sensor for determining whether an object to be placed such as a sample container is placed on each of the shelves.

By providing the sensor which determines whether an object to be placed is placed on each of the shelves as the above-mentioned rotary stocker, it is possible to readily determine the empty shelf in the rotary stocker. However, in the above-mentioned rotary stocker, it is necessary to provide the senor for respective shelves thus giving rise to the drawback that a manufacturing cost is pushed up.

SUMMARY OF THE INVENTION

It is an object of the present invention to provide a rotary stocker and a transfer system provided with the rotary stocker which can reduce a manufacturing cost.

To achieve the above-mentioned object, an aspect of the present invention is directed to a rotary stocker which includes: a base; a rotary part provided on the base and rotatably connected to the base about a rotary axis extending in a vertical direction; a rotary drive device provided for rotating the rotary part; a plurality of shelves on which an object to be placed is placed, the plurality of shelves being fixed to the rotary part and being arranged in a circumferential direction about the rotary axis; and a sensor positioned outside the plurality of shelves in a radial direction of the rotary axis, the sensor capable of detecting whether the object to be placed is placed on each of the shelves positioned between the rotary axis and the sensor.

According to the above-mentioned configuration, due to the rotation of the rotary part about the rotary axis, the plurality of shelves fixed to the rotary part can be sequentially positioned between the sensor and the rotary axis. Accordingly, it is possible to determine whether an object to be placed is placed with respect to the plurality of shelves using one sensor. Accordingly, compared to the case where a sensor is provided for respective shelves, a manufacturing cost of the rotary stocker can be reduced.

The above-mentioned rotary stocker may include: an extension part being fixed to the base and extending in the vertical direction at a position outside the plurality of shelves in the radial direction of the rotary axis; and a connection part extending from the extension part toward the rotary axis and rotatably connected to an upper end portion of the rotary part, in which the sensor may be provided on the extension part. With such a configuration, the connection part extending from the extension part toward the rotary axis is rotatably connected to the upper end portion of the rotary part and hence, it is possible to make the rotary axis of the rotary part stable with respect to the base. Further, the extension part is positioned outside the plurality of shelves in the radial direction of the rotary axis. Such positioning of the extension part is convenient for providing the sensor.

Further, in the above-mentioned rotary stocker, the plurality of shelves may form a plurality of first shelves, the sensor may form a first sensor fixed to the extension part, and the rotary stocker may further include: a plurality of second shelves which differ from the plurality of first shelves, the plurality of second shelves being fixed to the rotary part above the plurality of first shelves and being arranged in the circumferential direction about the rotary axis; and a second sensor being fixed to the extension part above the first sensor, the second sensor capable of detecting whether the object to be placed is placed on the second shelf positioned between the rotary axis and the second sensor. With such a configuration, the sensors which correspond to respective stages of the rotary stocker having a plurality of stages are provided and hence, by rotating the rotary part by one turn, it is possible to determine whether the object to be placed is placed on the shelves in the plurality of stages within a short time.

Alternatively, in the above-mentioned rotary stocker, the plurality of shelves may form a plurality of first shelves, the rotary stocker may further include: a plurality of second shelves which differ from the plurality of first shelves, the plurality of second shelves being fixed to the rotary part above the plurality of first shelves and being arranged in the circumferential direction about the rotary axis; a lifting part supported on the extension part, the lifting part capable of being lifted or lowered along the extension part; and a lifting drive device capable of lifting or lowering the lifting part, in which the sensor may be fixed to the lifting part, the sensor may detect whether the object to be placed is placed on the first shelf when the sensor is at a position which opposedly faces the first shelf in the radial direction, and may detect whether the object to be placed is placed on the second shelf when the sensor is at a position which opposedly faces the second shelf in the radial direction. With such a configuration, the sensor can be moved to the position which opposedly face the shelves of the plurality of respective stages of the rotary stocker by using the lifting drive device. Accordingly, it is possible to determine whether the object to be placed is placed with respect to the shelves in the plurality of stages which the rotary stocker has using one sensor.

In the above-mentioned rotary stocker, each of the shelves may have: a horizontal support surface which supports the object to be placed from below; and an inclined surface which is connected to an end portion of the support surface on a remote side with respect to the rotary axis and is inclined upward from the end portion toward the outside in the radial direction. With such a configuration, the inclined surface is formed on the end portion of the support surface on a remote side with respect to the rotary axis and hence, it is possible to prevent the object to be placed which is placed on the support surface of the shelf from being thrown away toward the outside in the radial direction due to a centrifugal force of the rotary part. Further, the inclined surface is inclined upward toward the outside in the radial direction and hence, loading and unloading of the object to be placed to and from the shelf can be performed easily.

Another aspect of the present invention is directed to a transfer system which transfers the object to be placed to the shelves, the transfer system including: the rotary stocker where the shelf has the inclined surface; a robot arm; an end effector provided on a distal end of the robot arm and capable of holding the object to be placed; and a controller for controlling the robot arm and the end effector, in which the controller controls the robot arm so as to bring the object to be placed which is held by the end effector into contact with the inclined surface, and controls the end effector so as to make the end effector release holding of the object to be placed when the object to be placed is brought into contact with the inclined surface. With such a configuration, when the object to be placed is brought into contact with the inclined surface, holding of the object to be placed by the end effector is released and hence, the object to be placed slides down onto the support surface along the inclined surface and is placed at a predetermined position on the support surface. Accordingly, positioning of the object to be placed in the radial direction of the rotary axis at the time of transferring the object to be placed to the shelf can be performed by making use of the inclined surface of the shelf.

According to the present invention, it is possible to provide a rotary stocker and a transfer system provided with the rotary stocker which can reduce a manufacturing cost.

The above-mentioned object, other objects, technical features and advantageous effects of the present invention will become apparent from the detailed description of preferred embodiments made hereinafter with reference to the attached drawings.

DETAILED DESCRIPTION OF PREFERRED EMBODIMENTS

First Embodiment

Figure 1:
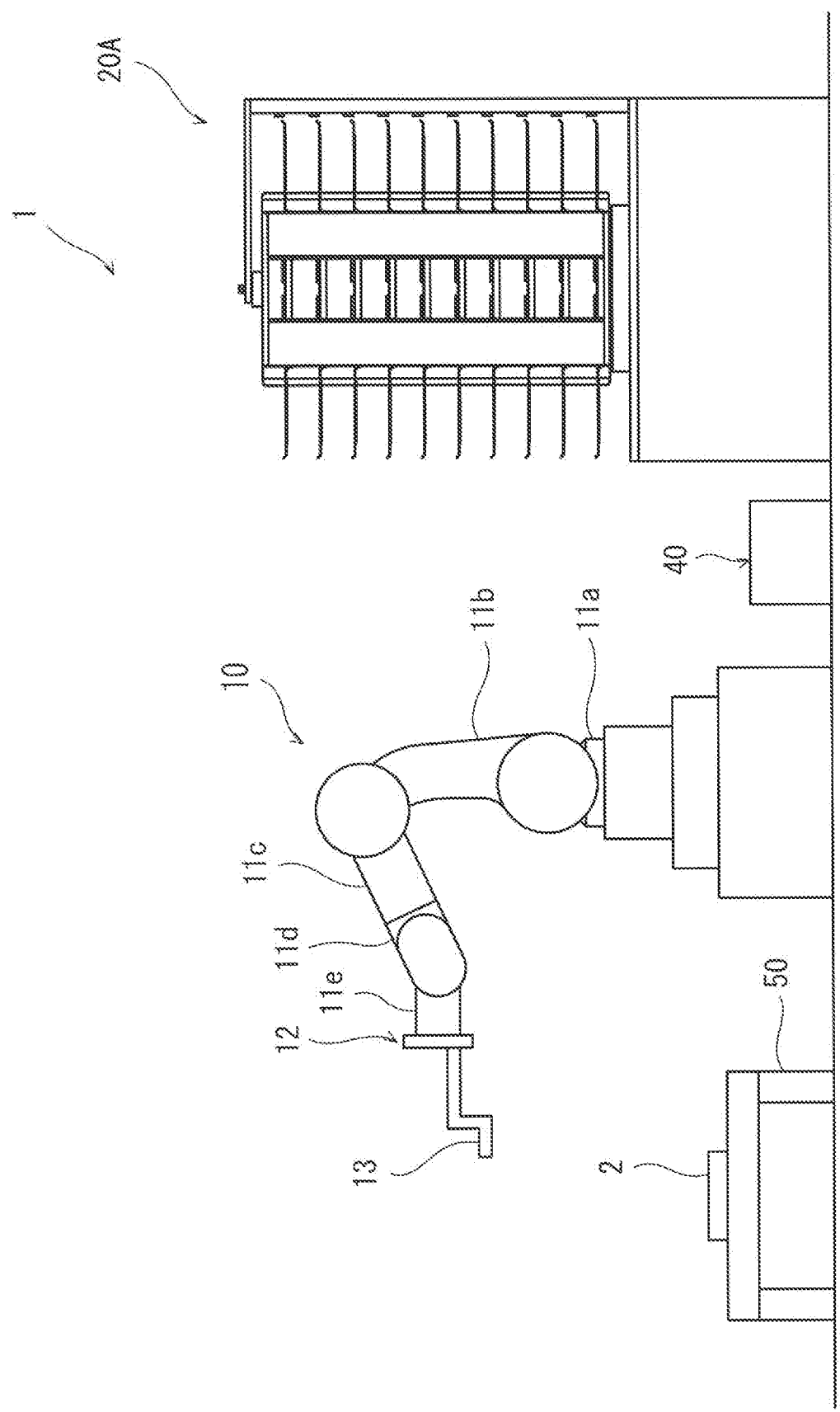
FIG. 1 is a schematic side view of a transfer system provided with a rotary stocker according to a first embodiment of the present invention.

Hereinafter, a rotary stocker and a transfer system provided with the rotary stocker according to a first embodiment of the present invention are described with reference to the attached drawings. FIG. 1 is a schematic side view of a transfer system 1 provided with a rotary stocker 20A according to the first embodiment.

The transfer system 1 includes: a robot arm 10 which transfers a container 2; the rotary stocker 20A; a controller 40 which controls the robot arm 10 and the rotary stocker 20A; and a container setting base 50. The rotary stocker 20A is configured to store a plurality of containers 2. The transfer system 1 is a system where one of the containers 2 stored in the rotary stocker 20A is transferred onto the container setting base 50 by the robot arm 10, and the container 2 on the container setting base 50 is stored in the rotary stocker 20A.

In this embodiment, as shown in FIG. 1, the robot arm 10 is a 5-axis vertical articulated robot arm formed by sequentially connecting a plurality of links 11a to 11e by five joints. The robot arm 10 may not be a vertical articulated robot arm, and may be a horizontal articulated robot arm, for example. Further, the number of axes of the robot arm 10 may not be five, and may be 4 axes or less or 6 axes or more.

To each joint of the robot arm 10, a drive motor (not shown) which rotates two members connected to each other by the joint relative to each other is provided. The drive motor is a servo motor which is subjected to a servo control by the controller 40, for example. To each joint of the robot arm 10, a rotary sensor (not shown) for detecting a rotational position of the drive motor, and a current sensor (not shown) for detecting an electric current which controls the rotation of the drive motor are provided. The rotary sensor is an encoder, for example.

Figure 2:
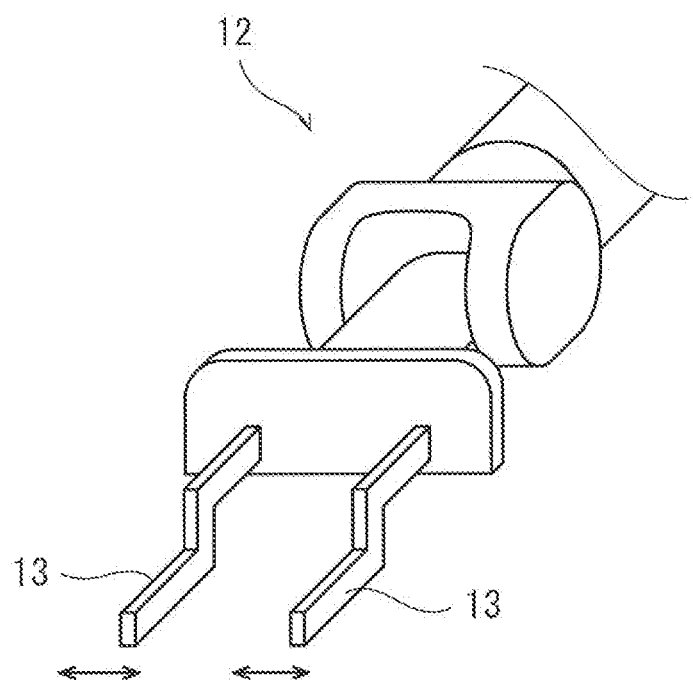
FIG. 2 is a perspective view of an end effector shown in FIG. 1.

An end effector 12 is provided on a distal end of the robot arm 10. FIG. 2 is a perspective view of the end effector 12. In this embodiment, the end effector 12 is configured to hold the container 2. To be more specific, the end effector 12 includes a pair of finger portions 13 which opposedly face each other. The pair of finger portions 13 are controlled by the controller 40 so that the pair of finger portions 13 are movable to approach each other or to be separated from each other. In a state where the container 2 is positioned between the finger portions 13, the finger portions 13 move to approach each other so that the finger portions 13 sandwich the container 2 and hold the container 2.

In the embodiment, the end effector 12 holds the container 2 by sandwiching the container 2 using the finger portions 13. However, the mode of holding the container 2 by the end effector 12 is not limited to this. For example, the end effector 12 may include a pair of hooks, and a pair of engaging portions which are engageable with the pair of hooks may be formed on the container 2. In this case, the end effector 12 may hold the container 2 by making the pair of hooks of the end effector 12 engage with the pair of engaging portions of the container 2.

Figure 3:
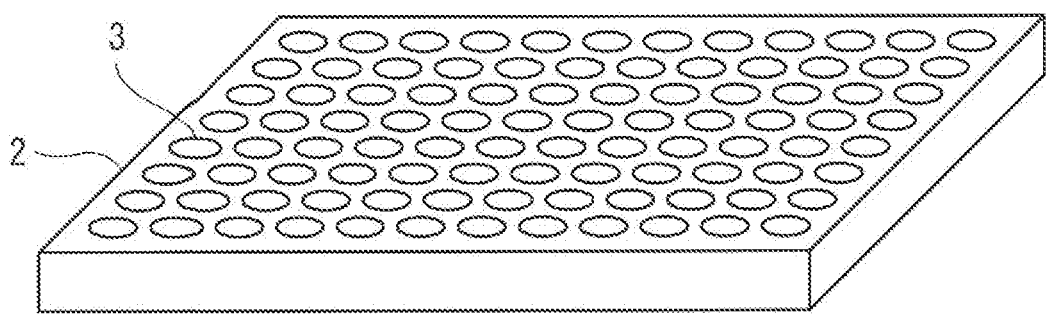
FIG. 3 is a perspective view of a container placed on a shelf of the rotary stocker shown in FIG. 1.

FIG. 3 is a perspective view showing the container 2. In this embodiment, the container 2 is used as a microplate mainly employed in a biochemical analysis, a clinical examination or the like. The container 2 is formed using a transparent resin. For example, the container 2 is formed by using polyethylene, polypropylene or the like. A plurality of wells 3 which are holes for storing a liquid are formed on the container 2. In this embodiment, twelve wells 3 are arranged along a long side of the container 2, and eight wells 3 are arranged along a short side of the container 2. Accordingly, ninety six wells 3 in total are formed on the container 2. A lid may be provided for covering an upper portion of the container 2.

Figure 4:
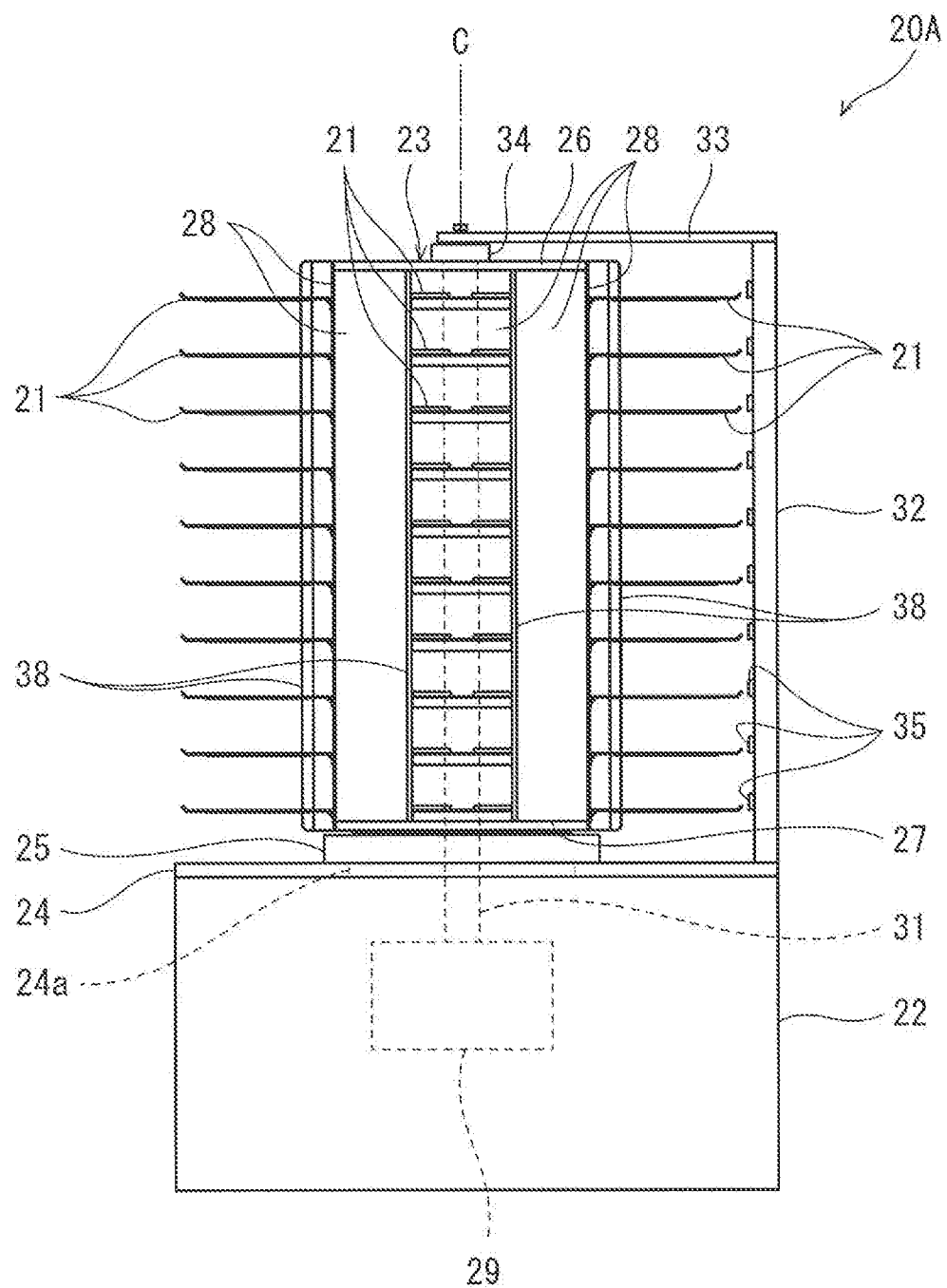
FIG. 4 is a schematic side view of the rotary stocker shown in FIG. 1.
Figure 5:
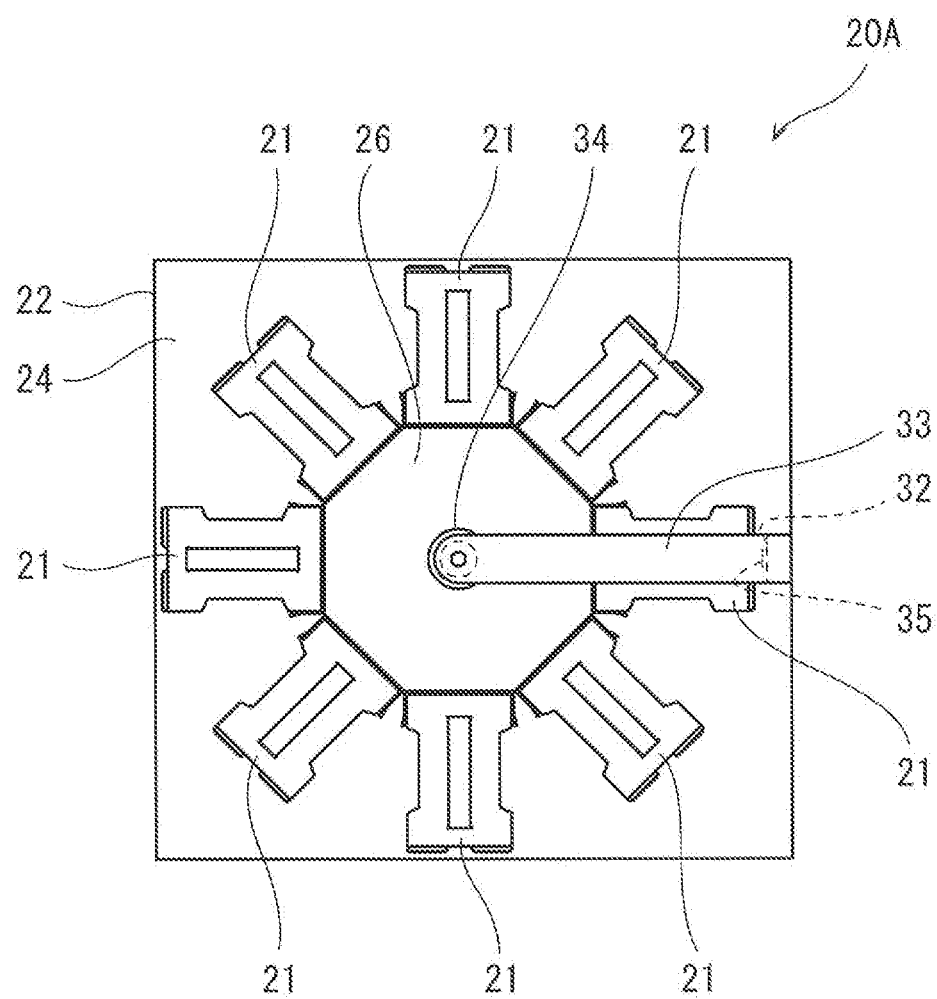
FIG. 5 is a schematic plan view of the rotary stocker shown in FIG. 1.

FIGS. 4 and 5 are respectively a schematic side view and a schematic plan view of the rotary stocker 20A. The rotary stocker 20A has a plurality of stages (10 stages in this embodiment), and a plurality of shelves 21 on each of which the container 2 (object to be placed) are placed are disposed on each stage.

To be more specific, the rotary stocker 20A includes a base 22, and a rotary part 23 which is rotatably connected to the base 22. The rotary part 23 is rotatable relative to the base 22 about a rotary axis C extending in a vertical direction. The base 22 has a support plate 24 which supports the rotary part 23 thereon. The support plate 24 is disposed on an upper portion of the base 22, and extends horizontally. A circular opening 24a is formed at a center of the support plate 24. An annular cross roller ring 25 which rotatably connects the base 22 and the rotary part 23 is disposed around the opening 24a formed in the base 22. The rotary part 23 is rotatably supported on the base 22 by way of the cross roller ring 25.

The rotary part 23 has an upper surface plate 26 and a lower surface plate 27 which opposedly face each other in the vertical direction. The upper surface plate 26 and the lower surface plate 27 has the same shape and the same size, and formed into a regular octagonal shape as shown in FIG. 5. The rotary part 23 has eight side surface plates 28 between the upper surface plate 26 and the lower surface plate 27. The eight side surface plates 28 respectively extend in a vertical direction, and connect respective sides of the upper surface plate 26 and the lower surface plate 27 each having a regular octagonal shape.

A rotary drive device 29 which rotates the rotary part 23 is disposed below the support plate 24 in the base 22. The rotary drive device 29 is a stepping motor, for example. The rotary drive device 29 is fixed to the base 22. The rotary drive device 29 has a shaft 31 which extends vertically and upwardly such that the shaft 31 passes through the opening 24a of the support plate 24. The rotary part 23 is connected to the shaft 31. By rotating the shaft 31 by the rotary drive device 29, the rotary part 23 is rotated. The rotary drive device 29 is controlled by the controller 40.

The plurality of shelves 21 described previously are fixed to the eight side surface plates 28. The shelf 21 is a plate-shaped member extending from the side surface plate 28 toward the outside in a radial direction of the rotary axis C. The rotary stocker 20A has the eight shelves 21 which are equal in number to the side surface plates 28 on each stage. The eight shelves 21 on each stage are disposed to be arranged in a circumferential direction about the rotary axis C. That is, in this embodiment, the rotary stocker 20A has ten stages and hence, the rotary stocker 20A has the eighty shelves 21 in total. In FIGS. 4 and 1 described previously, to facilitate the understanding of the present invention, the illustration of the shelves 21 fixed to part of the side surface plates 28 and guide portions 38 described later is omitted.

Further, a columnar extension part 32 which extends upward is fixed to the support plate 24 of the base 22. The extension part 32 is a plate-shaped member extending in a vertical direction. The extension part 32 is positioned outside the plurality of shelves 21 in a radial direction of the rotary axis C. The extension part 32 extends from the support plate 24 to a height position substantially equal to a height of an upper end portion of the rotary part 23. A connection part 33 which extends toward the rotary axis C and is connected to the upper end portion of the rotary part 23 is fixed to the upper end portion of the extension part 32. For example, a flange bearing or the like is provided on an end portion of the connection part 33 on a rotary axis C side so that the flange bearing or the like is rotatably connected to the upper end portion of the rotary part 23.

A plurality of sensors 35 are provided on the extension part 32. In this embodiment, the plurality of sensors 35 are provided corresponding to the respective stages of the rotary stocker 20A. To be more specific, the sensors 35 whose number (ten in this embodiment) is equal to the number of the stages of the rotary stocker 20A are provided in an arranged manner in a vertical direction on the extension part 32.

The sensor 35 detects whether the container 2 which is an object to be placed is placed on the shelf 21 of the stage corresponding to the sensor 35, to be more specific, the shelf 21 positioned at substantially the same height as the sensor 35. That is, due to the rotation of the rotary part 23 about the rotary axis C, one shelf 21 out of the eight shelves 21 of the stage corresponding to the sensor 35 is positioned between the sensor 35 and the rotary axis C, and faces the sensor 35 in a radial direction of the rotary axis C.

The sensor 35 detects whether the container 2 which is an object to be placed is placed on the shelf 21 positioned between the sensor 35 and the rotary axis C. For example, the sensor 35 is a photoelectric sensor which is arranged such that the sensor 35 emits light to a rotary axis C side and the emitted light impinges on the container 2 when the container 2 is placed on the shelf 21.

Figure 6A:
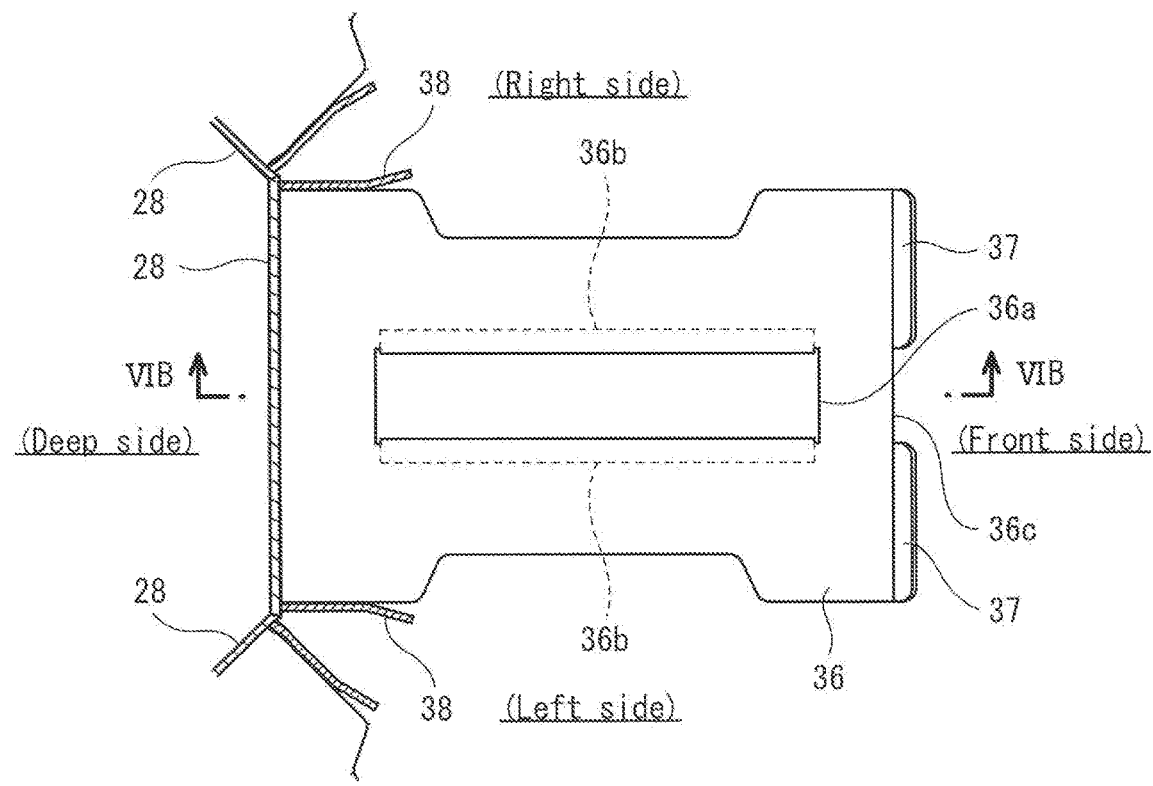
FIG. 6A is a schematic plan view showing a shelf of the rotary stocker in an enlarged manner.
Figure 6B:
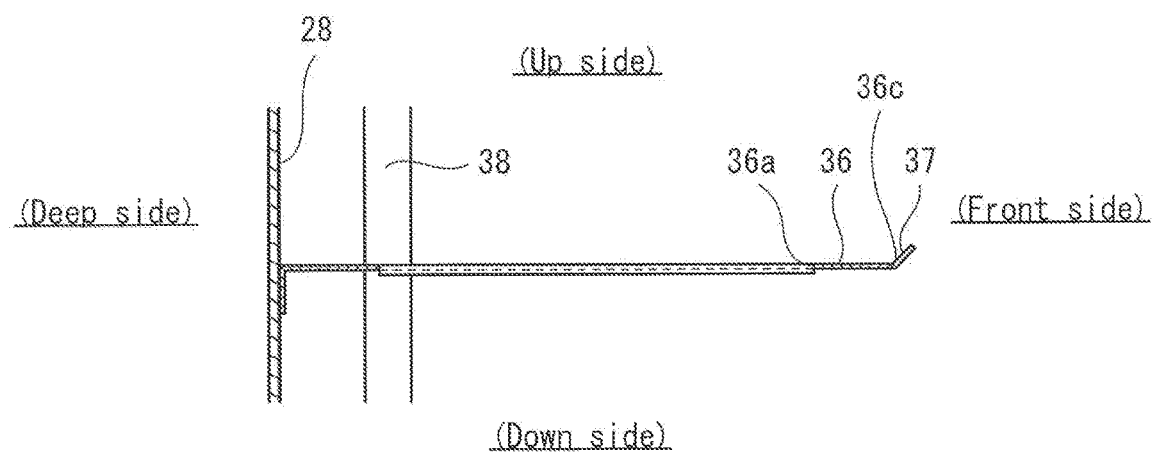
FIG. 6B is a cross-sectional side view as viewed taken along line VIB-VIB in FIG. 6A.

FIG. 6A is a plan view showing the shelf 21 of the rotary stocker 20A in an enlarged manner, and FIG. 6B is a cross-sectional side view as viewed taken along line VIB-VIB in FIG. 6A. In FIGS. 6A and 6B, a remote position side and a near position side from the rotary axis C are respectively referred to as "front side" and "deep side", and a left side and a right side of the shelf 21 when the shelf 21 is viewed from the front side are respectively referred to as "left side" and "right side".

The shelf 21 is a plate-shaped member extending substantially horizontally, and has a horizontal support surface 36 which supports the container 2 which is an object to be placed from below. The support surface 36 has an approximately rectangular shape, and an approximately rectangular cutaway portion 36a is formed at the center of the support surface 36 for reducing the weight of the shelf 21. A reinforcing portion 36b is formed on both ends of the cutaway portion 36a of the shelf 21 respectively in a lateral direction, and the respective reinforcing portions 36b are disposed along a depth direction of the shelf 21. The reinforcing portions 36b suppress downward sagging of the shelf 21 toward a front side. In this embodiment, the reinforcing portions 36b are formed by bending both side end edges of the cutaway portion 36a of the member which forms the support surface 36 in a lateral direction downward.

A pair of inclined surfaces 37 are continuously formed on a front side end portion 36c of the support surface 36. The pair of inclined surfaces 37 are spaced apart from each other in a lateral direction. The pair of inclined surfaces 37 are inclined upward toward the outside of the rotary axis C in a radial direction. The inclined surfaces 37 prevent the container 2 placed on the support surface 36 of the shelf 21 from being thrown away toward the outside in a radial direction due to a centrifugal force of the rotary part 23. Further, the inclined surfaces 37 are inclined upward toward the outside in a radial direction and hence, loading and unloading of the container 2 to and from the shelf 21 can be performed easily.

The pair of guide portions 38 for guiding the container 2 in a depth direction of the shelf 21 are provided on the side surface plate 28. The pair of guide portions 38 are disposed in a spaced-apart manner from each other in a lateral direction of the shelf 21, and extend from the side surface plate 28 toward the outside in a radial direction of the rotary axis C. A distance between deep side portions of the pair of guide portions 38 is fixed, and is a length which allows fitting of the container 2. A distance between front side portions of the pair of guide portions 38 is increased as the front side portions extend away from the side surface plate 28. Even when the container 2 is positionally displaced in a lateral direction with respect to the shelf 21 at the time of storing the container 2 in the rotary stocker 20A, the container 2 is guided by the guide portions 38 and hence, positioning of the container 2 in the lateral direction with respect to the shelf 21 can be performed easily.

Returning to FIG. 1, the controller 40 controls operations of the robot arm 10, the end effector 12, and the rotary stocker 20A. The controller 40 has, for example, a microcontroller, a programmable logic controller (PLC), an arithmetic operation part formed of a logic circuit and the like (not shown), and a memory part formed of a ROM, a RAM and the like (not shown). Information such as a basic program, various fixed data and the like is stored in the memory part. The arithmetic operation part reads and executes software such as the basic program stored in the memory part, and controls various operations of the robot arm 10, the end effector 12, and the rotary stocker 20A.

The controller 40 may be formed of a single controller 40 which performs a centralized control or may be formed of a plurality of controllers 40 which perform a decentralized control in a cooperative manner. For example, a control unit for controlling the robot arm 10 and the end effector 12 and a control unit for controlling the rotary stocker 20A may be provided separately.

Detection information indicative of the presence or the absence of the containers 2 on the shelves 21 is transmitted from the respective sensors 35 of the rotary stocker 20A to the controller 40. The detection information is stored in the memory part of the controller 40. In the memory part of the controller 40, rotational position information indicative of the rotational position of the rotary part 23 is stored. In this embodiment, a rotary sensor such as an encoder (not shown) or the like is provided on the rotary drive device 29, and rotational position information which the rotary sensor detects is transmitted to the controller 40. However, a method of acquiring rotational position information by the controller 40 is not particularly limited. For example, the controller 40 may acquire rotational position information indicative of the rotational position of the rotary part 23 by calculating the rotational position based on a value of an electric current for driving the rotary drive device 29.

Next, as one example of the flow of the operation of the transfer system 1 in this embodiment, the flow of the operation when the container 2 on the container setting base 50 is placed on the shelf 21 of the rotary stocker 20A is described. The operations of the robot arm 10, the end effector 12, and the rotary stocker 20A are controlled by the controller 40.

Firstly, in the transfer system 1, before the transfer of the container 2 to the shelf 21 of the rotary stocker 20A is performed, the controller 40 determines which shelves 21 of the rotary stocker 20A are empty based on detection information from the sensors 35 and rotational position information of the rotary part 23.

To be more specific, the rotary drive device 29 rotates the rotary part 23 such that one shelf 21 out of the plurality of shelves 21 arranged in the circumferential direction about the rotary axis C in each stage is positioned between the rotary axis C and the sensor 35. Then, the sensor 35 on each stage detects whether the container 2 is placed on the shelf 21 between the rotary axis C and the sensor 35. In this manner, in the memory part of the controller 40, rotational position information of the rotary part 23 and detection information from the sensors 35 are stored as a set. Next, the rotary drive device 29 rotates the rotary part 23 such that the next shelf 21 disposed adjacently in the circumferential direction to the shelf 21 where whether the container 2 is placed on the shelf 21 is confirmed opposedly faces the sensor 35. Then, the sensor 35 detects whether the container 2 is placed on the shelf 21 which oppposedly faces the sensor 35. In the memory part of the controller 40, rotational position information of the rotary part 23 and detection information from the sensor 35 are stored as a set. In this manner, the plurality of shelves 21 fixed to the rotary part 23 are sequentially positioned between the sensor 35 and the rotary axis C, and the detection information from each sensor 35 and rotational position information of the rotary part 23 are stored. Accordingly, the controller 40 can determine which shelves 21 of the rotary stocker 20A are empty.

The controller 40 decides the shelf 21 on which the container 2 on the container setting base 50 is to be placed among the empty shelves 21. However, an operator who operates the controller 40 may decide the shelf 21 on which the container 2 is to be placed. When the shelf 21 on which the container 2 is to be placed is decided, the controller 40 operates the end effector 12 such that the end effector 12 holds (grips) the container 2 on the container setting base 50, and operates the robot arm 10 such that the container 2 is moved to a position above the shelf 21.

Figure 7A:
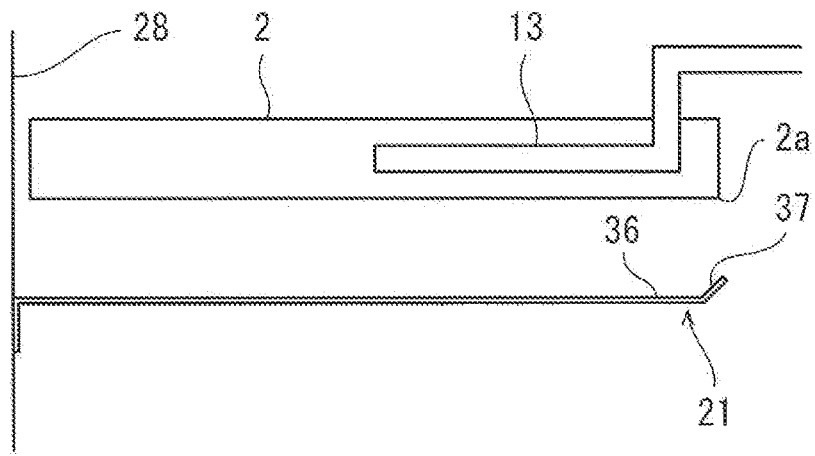
FIG. 7A is a partially enlarged side view of the rotary stocker showing a state where a container is placed on a shelf by the end effector in accordance with time sequence.
Figure 7B:
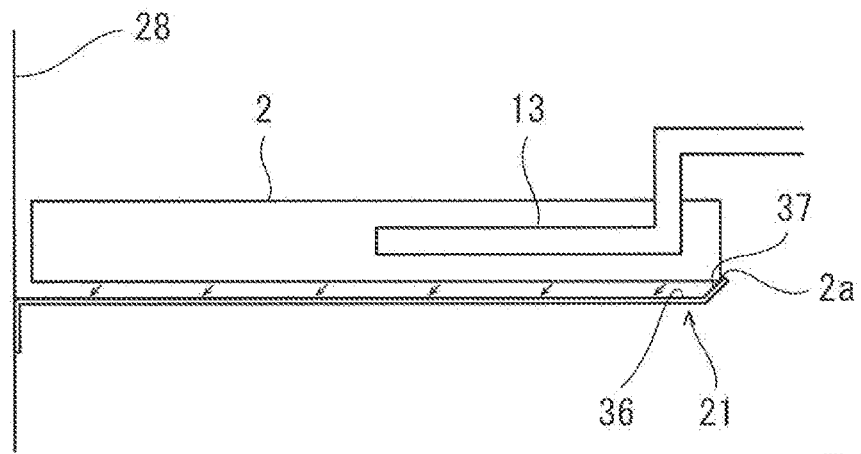
FIG. 7B is a partially enlarged side view of the rotary stocker showing a state where a container is placed on a shelf by the end effector in accordance with time sequence.
Figure 7C:
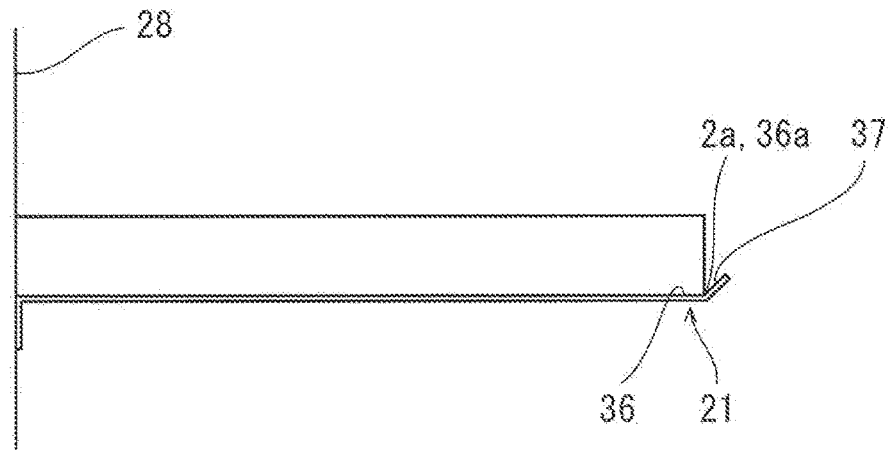
FIG. 7C is a partially enlarged side view of the rotary stocker showing a state where a container is placed on a shelf by the end effector in accordance with time sequence.

FIGS. 7A to 7C are partially enlarged side views of the rotary stocker showing a state where the container 2 is placed on the shelf 21 by the end effector 12 in accordance with time sequence. As shown in FIG. 7A, the robot arm 10 moves the container 2 held by the end effector 12 immediately above the shelf 21.

Then, the robot arm 10 places the container 2 on the shelf 21 such that one end edge 2a of a lower surface of the container 2 is positioned at a predetermined position of the shelf 21. To be more specific, as shown in FIG. 7B, the robot arm 10 moves the container 2 such that the end edge 2a of the container 2 held by the end effector 12 is brought into contact with the inclined surfaces 37. The controller 40 controls the end effector 12 such that the end effector 12 releases holding of the container 2 when the end edge 2a of the container 2 is brought into contact with the inclined surfaces 37.

With such a control, as indicated by an arrow shown in FIG. 7B, the container 2 slides down onto the support surface 36 along the inclined surfaces 37. As a result, as shown in FIG. 7C, the container 2 is placed at the predetermined position on the support surface 36 such that the end edge 2a agrees with a boundary portion between the support surface 36 and the inclined surfaces 37 (that is, the front side end portion 36c of the support surface 36). Accordingly, in the transfer of the container 2 to the shelf 21, positioning of the container 2 in the radial direction of the rotary axis C can be performed by making use of the inclined surfaces 37 of the shelf 21.

As described above, in the rotary stocker 20A and the transfer system 1 provided with the rotary stocker 20A according to this embodiment, the plurality of shelves 21 fixed to the rotary part 23 can be sequentially positioned between the sensor 35 and the rotary axis C by rotating the rotary part 23 about the rotary axis C. Accordingly, it is possible to determine whether the container 2 is placed with respect to the plurality of shelves 21 disposed on each stage using one sensor 35. Accordingly, compared to the case where a sensor is provided for each shelf 21, a manufacturing cost of the rotary stocker 20A can be redeced.

Further, in this embodiment, an upper end portion of the rotary part 23 is held by the connection part 33 extending from the extension part 32 toward the rotary axis C. Accordingly, the rotary axis C of the rotary part 23 can be made stable with respect to the base 22. Further the extension part 32 is positioned outside the plurality of shelves 21 in the radial direction of the rotary axis C. Such positioning of the extension part 32 is convenient for providing the sensors 35.

In this embodiment, the sensors 35 are provided corresponding to the plurality of respective stages of the rotary stocker 20A. Accordingly, by rotating the rotary part 23 by one turn, it is possible to determine whether the containers 2 are placed on the shelves 21 on the plurality of stages within a short time.

Second Embodiment

Next, a rotary stocker 20B according to a second embodiment of the present invention is described with reference to FIG. 8. In this embodiment, constitutional elements identical with corresponding constitutional elements in the first embodiment are given the same symbols, and the repeated description of these constitutional elements is omitted.

Figure 8:
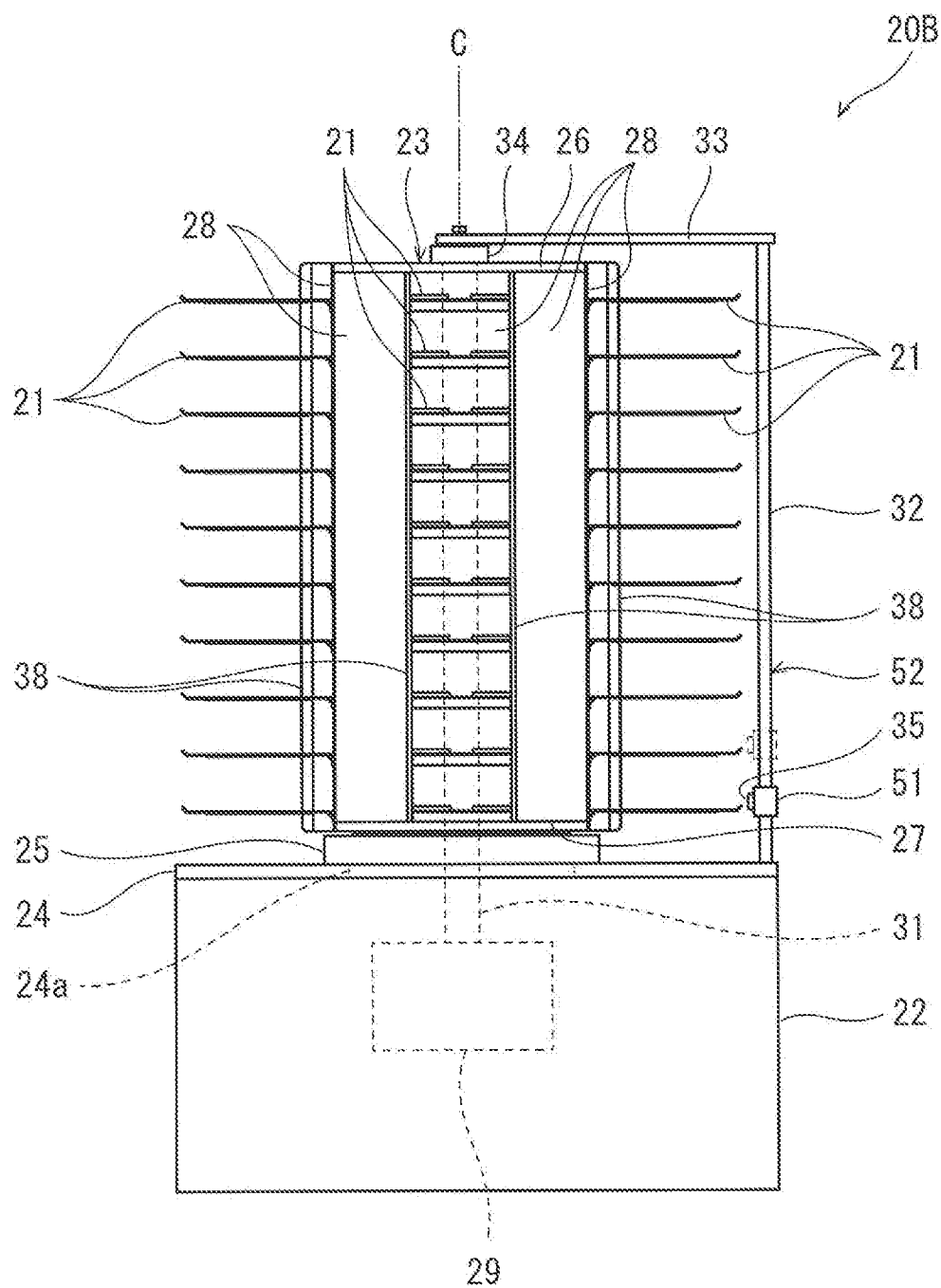
FIG. 8 is a schematic side view of a rotary stocker according to a second embodiment of the present invention.

FIG. 8 is a schematic side view of the rotary stocker 20B according to the second embodiment. This embodiment differs from the first embodiment in that a plurality of sensors 35 are not provided on an extension part 32, and only one sensor 35 is provided on the extension part 32.

To be more specific, in the rotary stocker 20B, a lifting part 51 is supported on the extension part 32 in a liftable manner along the extension part 32. The lifting part 51 is lifted or lowered by a lifting drive device 52. The lifting drive device 52 is, for example, an electrically operated actuator, a pneumatic actuator or the like. The lifting drive device 52 is controlled by a controller 40.

The sensor 35 is fixed to the lifting part 51. The lifting part 51 can be lifted or lowered from a height of a shelf 21 on the lowermost stage to a height of a shelf 21 on the uppermost stage.

The controller 40 stores height information indicative of the height of the shelf of the stage at which the sensor 35 is positioned together with detection information from the sensor 35 and rotational position information of a rotary part 23 as a set. The controller 40 determines which shelves 21 of the rotary stocker 20B are empty based on these detection information, rotational position information, and height information.

To be more specific, when the lifting part 51 is positioned at the height of the shelves (first shelves) 21 on the lowermost stage, the sensor 35 can oppositely face one of the selves (first shelves) 21 on the lowermost stage in a radial direction. Then, a rotary drive device 29 rotates the rotary part 23 so that the shelves 21 on the lowermost stage are sequentially positioned between a rotary axis C and the sensor 35, and the sensor 35 detects whether a container 2 is placed on the shelf 21. In this manner, in a memory part of the controller 40, height information of the sensor 35 is stored together with rotational position information of the rotary part 23 and detection information from the sensor 35 as a set. Then, the lifting part 51 is moved to the height of the shelves (second shelves) 21 which are disposed above the shelves (first shelves) 21 of the lowermost stage by one stage by driving the lifting drive device 52, and the rotation of the rotary part 23 and the detection by the sensor 35 are repeated in the same manner. In this manner, the controller 40 stores information identifying the position (rotational position information and height information) and information with respect to the presence or the absence of an object to be placed (detection information) with respect to all shelves 21. Accordingly, the controller 40 can determine which shelves 21 of the rotary stocker 20B are empty.

This embodiment can also acquire substantially the same advantageous effects as the first embodiment. Further, in this embodiment, it is possible to move the sensor 35 at the positions which oppposedly face the shelves 21 of the plurality of respective stages of the rotary stocker 20B by using the lifting drive device 52. Using one sensor 35, it is possible to determine whether an object to be placed is placed with respect to all shelves 21 which the rotary stocker 20B has.

Other Embodiments

The present invention is not limited to the above-mentioned embodiments, and various modifications are conceivable without departing from the gist of the present invention.

For example, in the above-mentioned embodiments, the container 2 which is an object to be placed on the shelf 21 is a microplate. However, the object to be placed is not limited to a microplate, and for example, the object to be placed may be a chip rack. Further, in the above-mentioned embodiments, the number of stages in the rotary stockers 20A, 20B is ten, and the number of shelves 21 per stage is eight. However, the number of stages and the number of shelves in the rotary stocker of the present invention are not limited to such numbers. For example, the number of stages in the rotary stocker of the present invention may be one. Further, the number of shelves 21 on each stage of the rotary stocker of the present invention may be two or more.

The shelves 21 of the rotary stockers 20A, 20B are not limited to the shelves described in the above-mentioned embodiments. For example, the shelf 21 may not have the inclined surfaces 37 or the cutaway portion 36a may not be formed in the shelf 21.

In the above-mentioned embodiments, the extension part 32 on which the sensors 35 are provided has a columnar shape. However, the extension part 32 may have a plate shape. In the case where the rotary stocker has a cover part which covers the rotary part 23 from above and sides, the extension part 32 may be formed of a portion of the cover part.

What is claimed is:

1. A rotary stocker comprising:
a base;
a rotary part provided on the base and rotatably connected to the base about a rotary axis extending in a vertical direction;
a rotary drive device provided for rotating the rotary part;

a plurality of shelves on which an object to be placed is placed, the plurality of shelves being fixed to the rotary part and being arranged in a circumferential direction about the rotary axis; and a sensor positioned outside the plurality of shelves in a radial direction of the rotary axis, the sensor capable of detecting whether the object to be placed is placed on each of the shelves positioned between the rotary axis and the sensor.

2. The rotary stocker according to claim 1, wherein each of the shelves has: a horizontal support surface which supports the object to be placed from below; and an inclined surface which is connected to an end portion of the support surface on a remote side with respect to the rotary axis and is inclined upward from the end portion toward the outside in the radial direction.

3. The rotary stocker according to claim 1 further comprising:

an extension part being fixed to the base and extending in the vertical direction at a position outside the plurality of shelves in the radial direction of the rotary axis; and a connection part extending from the extension part toward the rotary axis and rotatably connected to an upper end portion of the rotary part, wherein the sensor is provided on the extension part.

4. The rotary stocker according to claim 3, wherein each of the shelves has: a horizontal support surface which supports the object to be placed from below; and an inclined surface which is connected to an end portion of the support surface on a remote side with respect to the rotary axis and is inclined upward from the end portion toward the outside in the radial direction.

5. The rotary stocker according to claim 3, wherein the plurality of shelves form a plurality of first shelves, the sensor forms a first sensor fixed to the extension part, the rotary stocker further comprising: a plurality of second shelves which differ from the plurality of first shelves, the plurality of second shelves being fixed to the rotary part above the plurality of first shelves and being arranged in the circumferential direction about the rotary axis; and a second sensor being fixed to the extension part above the first sensor, the second sensor capable of detecting whether the object to be placed is placed on each of the second shelves positioned between the rotary axis and the second sensor.

6. The rotary stocker according to claim 5, wherein each of the shelves has: a horizontal support surface which supports the object to be placed from below; and an inclined surface which is connected to an end portion of the support surface on a remote side with respect to the rotary axis and is inclined upward from the end portion toward the outside in the radial direction.

7. The rotary stocker according to claim 3, wherein the plurality of shelves form a plurality of first shelves, the rotary stocker further comprising: a plurality of second shelves which differ from the plurality of first shelves, the plurality of second shelves being fixed to the rotary part above the plurality of first shelves and being arranged in the circumferential direction about the rotary axis;

a lifting part supported on the extension part, the lifting part capable of being lifted or lowered along the extension part; and a lifting drive device capable of lifting or lowering the lifting part, wherein the sensor is fixed to the lifting part, the sensor detects whether the object to be placed is placed on each of the first shelves when the sensor is at a position which opposedly faces each of the first shelves in the radial direction, and detects whether the object to be placed is placed on each of the second shelves when the sensor is at a position which opposedly faces each of the second shelves in the radial direction.

8. The rotary stocker according to claim 7, wherein each of the shelves has: a horizontal support surface which supports the object to be placed from below; and an inclined surface which is connected to an end portion of the support surface on a remote side with respect to the rotary axis and is inclined upward from the end portion toward the outside in the radial direction.

9. A transfer system which transfers an object to be placed to shelves, the transfer system comprising:

a rotary stocker;

a robot arm;

an end effector provided on a distal end of the robot arm and capable of holding the object to be placed; and a controller for controlling the robot arm and the end effector, wherein the rotary stocker comprises:

a base;

a rotary part provided on the base and rotatably connected to the base about a rotary axis extending in a vertical direction;

a rotary drive device provided for rotating the rotary part;

a plurality of shelves on which an object to be placed is placed, the plurality of shelves being fixed to the rotary part and being arranged in a circumferential direction about the rotary axis; and a sensor positioned outside the plurality of shelves in a radial direction of the rotary axis, the sensor capable of detecting whether the object to be placed is placed on each of the shelves positioned between the rotary axis and the sensor, each of the shelves has:

a horizontal support surface which supports the object to be placed from below; and an inclined surface which is connected to an end portion of the support surface on a remote side with respect to the rotary axis and is inclined upward from the end portion toward the outside in the radial direction, and the controller controls the robot arm so as to bring the object to be placed which is held by the end effector into contact with the inclined surface, and controls the end effector so as to make the end effector release holding of the object to be placed when the object to be placed is brought into contact with the inclined surface.

10. The transfer system according to claim 9 further comprising:

an extension part being fixed to the base and extending in the vertical direction at a position outside the plurality of shelves in the radial direction of the rotary axis; and a connection part extending from the extension part toward the rotary axis and rotatably connected to an upper end portion of the rotary part, wherein the sensor is provided on the extension part.

11. The transfer system according to claim 10, wherein the plurality of shelves form a plurality of first shelves, the sensor forms a first sensor fixed to the extension part, the rotary stocker further comprising: a plurality of second shelves which differ from the plurality of first shelves, the plurality of second shelves being fixed to the rotary part above the plurality of first shelves and being arranged in the circumferential direction about the rotary axis; and a second sensor being fixed to the extension part above the first sensor, the second sensor capable of detecting whether the object to be placed is placed on each of the second shelves positioned between the rotary axis and the second sensor.

12. The transfer system according to claim 10, wherein the plurality of shelves form a plurality of first shelves, the rotary stocker further comprising: a plurality of second shelves which differ from the plurality of first shelves, the plurality of second shelves being fixed to the rotary part above the plurality of first shelves and being arranged in the circumferential direction about the rotary axis;

a lifting part supported on the extension part, the lifting part capable of being lifted or lowered along the extension part; and a lifting drive device capable of lifting or lowering the lifting part, wherein the sensor is fixed to the lifting part, the sensor detects whether the object to be placed is placed on each of the first shelves when the sensor is at a position which opposedly faces each of the first shelves in the radial direction, and detects whether the object to be placed is placed on each of the second shelves when the sensor is at a position which opposedly faces each of the second shelves in the radial direction.

* * * * *